United States Patent
Evans et al.

(10) Patent No.: US 10,698,443 B2
(45) Date of Patent: Jun. 30, 2020

(54) COMPUTING DEVICES WITH AN ADHERED COVER AND METHODS OF MANUFACTURING THEREOF

(71) Applicant: Microsoft Technology Licensing, LLC, Redmond, WA (US)

(72) Inventors: Ryan Travis Evans, Bellevue, WA (US); Bernard Maurice Schultz, III, Bothell, WA (US); Jason Edward Tripard, Mercer Island, WA (US); Ketan R. Shah, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/691,965

(22) Filed: Aug. 31, 2017

(65) Prior Publication Data
US 2018/0314293 A1 Nov. 1, 2018

Related U.S. Application Data

(60) Provisional application No. 62/492,431, filed on May 1, 2017.

(51) Int. Cl.
*G06F 1/16* (2006.01)
*B32B 7/12* (2006.01)
(Continued)

(52) U.S. Cl.
CPC .............. *G06F 1/1626* (2013.01); *B32B 7/12* (2013.01); *G06F 1/1601* (2013.01);
(Continued)

(58) Field of Classification Search
None
See application file for complete search history.

(56) References Cited

U.S. PATENT DOCUMENTS 6,977,818 B1* 12/2005 Depew ................. H01L 23/433
361/719
7,931,771 B2 4/2011 Watanabe
(Continued)

FOREIGN PATENT DOCUMENTS

| WO | 1996036675 A1 | 11/1996 |
| WO | 2015045249 A1 | 4/2015 |
| WO | 2015048772 A1 | 4/2015 |

OTHER PUBLICATIONS

"Optical Display & Touch Screen Laminating Adhesives", http://www.intertronics.co.uk/product/optical-display-bonding-touch-screen-laminating-adhesives/, Published on: Jan. 2017, 6 pages.
(Continued)

*Primary Examiner* — Courtney L Smith
*Assistant Examiner* — Rashen E Morrison
(74) *Attorney, Agent, or Firm* — Ray Quinney & Nebeker P.C.; Paul N. Taylor

(57) ABSTRACT

A computing device is described. The computing device includes a support structure with an interface surface that has a cross-sectional width. The computing device includes a cover adhered to the interface surface of the support structure along an entirety of the cross-sectional width of the interface surface. A method of manufacturing a computing device is described. The method includes applying an adhesive to a cover. A support structure of a computing device is heated. The support structure is cooled. While the support structure is heated and cooled, pressure is applied to the cover.

20 Claims, 4 Drawing Sheets

(51) Int. Cl.
   *H01L 23/10* (2006.01)
   *G06F 1/18* (2006.01)
   *H01L 23/04* (2006.01)

(52) U.S. Cl.
   CPC .......... *G06F 1/1616* (2013.01); *G06F 1/1656* (2013.01); *G06F 1/181* (2013.01); *H01L 23/10* (2013.01); *G06F 2200/1633* (2013.01); *H01L 23/04* (2013.01); *H01L 2224/1601* (2013.01); *H01L 2924/164* (2013.01); *H01L 2924/16152* (2013.01)

(56) References Cited

U.S. PATENT DOCUMENTS

| | | | | |
|---|---|---|---|---|
| 8,237,063 | B2* | 8/2012 | Chang | H05K 9/00 |
| | | | | 174/382 |
| 8,828,163 | B2 | 9/2014 | Hill | |
| 8,875,652 | B2 | 11/2014 | Feinstein et al. | |
| 9,454,038 | B2 | 9/2016 | Jeon et al. | |
| 9,829,216 | B2* | 11/2017 | Prutsman | F24J 2/485 |
| 10,007,302 | B2* | 6/2018 | Brown | G06F 1/1658 |
| 2008/0081679 | A1* | 4/2008 | Kawasaki | H04B 1/3888 |
| | | | | 455/575.8 |
| 2009/0257207 | A1* | 10/2009 | Wang | G06F 1/1626 |
| | | | | 361/752 |
| 2009/0280316 | A1 | 11/2009 | Lee et al. | |
| 2010/0203931 | A1* | 8/2010 | Hynecek | A45C 11/00 |
| | | | | 455/575.8 |
| 2012/0068798 | A1* | 3/2012 | Lauder | G06F 1/1613 |
| | | | | 335/306 |
| 2012/0202300 | A1 | 8/2012 | Yu et al. | |
| 2014/0305425 | A1* | 10/2014 | Prutsman | F24J 2/485 |
| | | | | 126/635 |
| 2015/0096687 | A1 | 4/2015 | Tsuboi et al. | |
| 2015/0346778 | A1* | 12/2015 | Yang | H04M 1/0202 |
| | | | | 361/679.3 |
| 2016/0198071 | A1 | 7/2016 | Leong et al. | |

OTHER PUBLICATIONS

"International Search Report and Written Opinion Issued in PCT Application No. PCT/US2018/028462", dated Jul. 31, 2018, 13 Pages.

* cited by examiner

COMPUTING DEVICES WITH AN ADHERED COVER AND METHODS OF MANUFACTURING THEREOF

CROSS-REFERENCE TO RELATED APPLICATIONS

This application claims the benefit of and priority to U.S. Provisional Patent Application No. 62/492,431, filed on May 1, 2017, which is hereby incorporated by reference in its entirety.

BACKGROUND

Background and Relevant Art

Use of computing devices is becoming more ubiquitous by the day. Computing devices range from standard desktop computers to wearable computing technology and beyond. One area of computing devices that has grown in recent years is the hybrid computers. Hybrid computers may act as a tablet computer or a laptop computer. Many hybrid computers include input devices that may be separated from the screen.

The subject matter claimed herein is not limited to example implementations that solve any disadvantages or that operate only in environments such as those described above. Rather, this background is only provided to illustrate one exemplary technology area where some example implementations described herein may be practiced.

BRIEF SUMMARY

An example implementation of a computing device is described. The computing device includes a support structure with an interface surface that has a cross-sectional width. The computing device includes a cover adhered to the interface surface of the support structure along an entirety of the cross-sectional width of the interface surface.

An example implementation of a method of manufacturing a computing device is described. The method includes applying an adhesive to a cover. A support structure of a computing device is heated. The support structure is cooled. While the support structure is heated and cooled, pressure is applied to the cover.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the example implementations may be realized and obtained by means of the instruments and combinations particularly pointed out in the appended claims. Features of the example implementations will become more fully apparent from the following description and appended claims, or may be learned by the practice of the example implementations as set forth hereinafter.

BRIEF DESCRIPTION OF THE DRAWINGS

In order to describe the manner in which the above-recited and other features of the disclosure can be obtained, a more particular description will be rendered by reference to specific example implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the example implementations will be described and explained with additional specificity and detail through the use of the accompanying drawings in which.

DETAILED DESCRIPTION

This disclosure generally relates to computing devices with adhered covers and methods of manufacturing thereof. More particularly, this disclosure generally relates to computing devices with a support structure (e.g., a bucket) and a cover adhered to the support structure at an interface surface and methods of manufacturing the same.

Fabrics may be used in manufacturing various components of computing devices. Fabrics may be attached to support structures. In some situations, an interface surface of a support structure may be small. When a cover is adhered to a small interface surface, often the cover will not adhere to an entirety of the interface surface.

Figure 1:
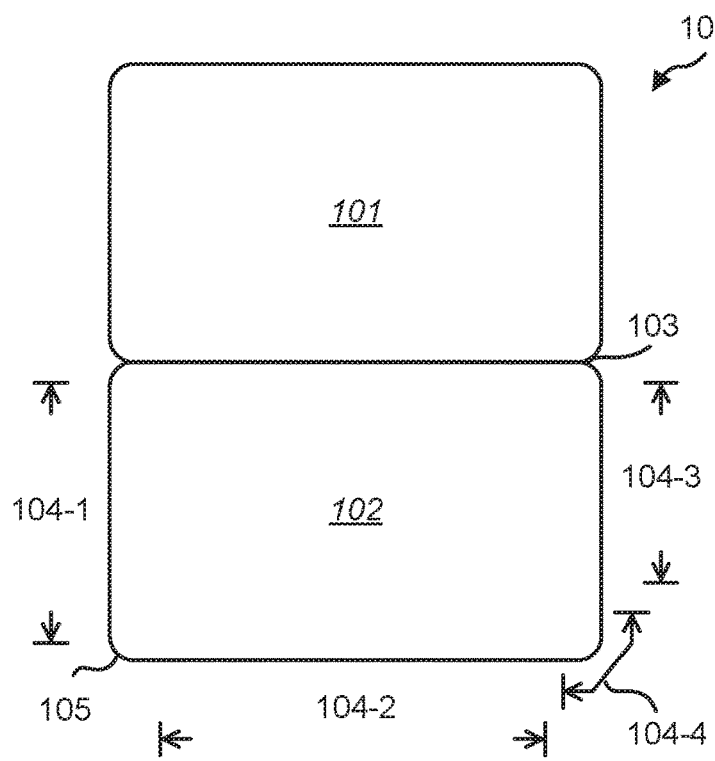
FIG. 1 is a perspective view of an example implementation of a computing device in an open configuration.

FIG. 1 is a perspective view of an example implementation of a computing device 100 in an open configuration. The computing device 100 is shown as a laptop. In other example implementations, the computing device 100 may be a smartphone, a tablet, a watch, a desktop, a game controller, a camera, other computing devices, and accessories therefor. The computing device 100 is shown with a display 101 and an input device 102. The computing device 100 may include a processor, memory, input/output connections, communication devices, other computing components, or combinations thereof. One or more computing components may be found in the display 101 and/or the input device 102.

The computing device 100 is shown with one or more edges 104 having a length. One or more of the edges 104 may form a perimeter 105 of the computing device. The first edge 104-1 extends along the depth of the input device 102, the second edge 104-2 extends along the width of the input device 102, the third edge 104-3 extends along a portion of the depth of the input device 102 along the right side, and the fourth edge 104-4 extends around a corner of the input device 102 between two edges (e.g., edge 104-2 and the right edge of the input device).

Figure 2:
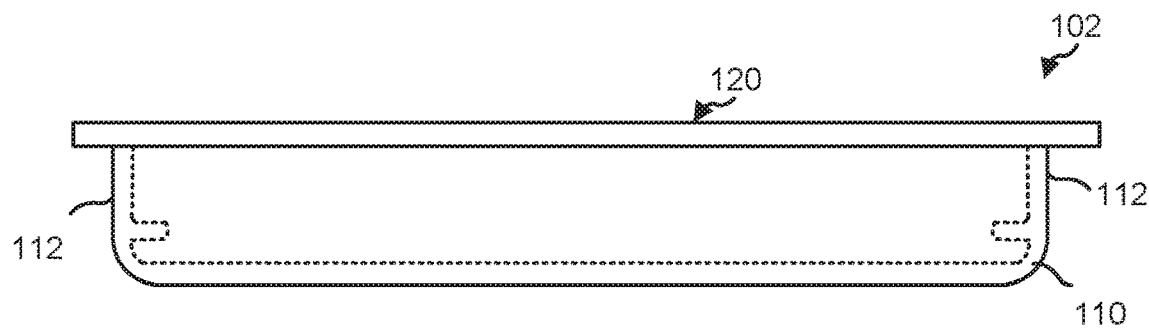
FIG. 2 is a side cross-sectional view of the example implementation of FIG. 1.

FIG. 2 is a side cross-sectional view of the example implementation of an input device 102 of FIG. 1. Although the input device 102 is described, this description may also apply to other components (e.g., the display 101, other input devices, and accessories) of the computing device 100. The computing device 100 may include a support structure 110 (e.g., a bucket). The support structure 110 may have one or more edges 112.

A cover 120 may be connected to the support structure 110 at or near the one or more edges 112. The cover 120 may be connected to the support structure 110 by an adhesive 111. The adhesive 111 may be applied to a bottom surface of the cover 120. The adhesive 111 may be cured to an interface surface 119 of the support structure. The adhesive 111 may be a heat activated adhesive, such as a heat activated film. For example, the adhesive 111 may require a minimum amount of heat for a minimum amount of time to cure the adhesive 111. In some example implementations, the heat required to cure the adhesive 111 may be above 100 degrees Celsius and/or the time required for curing the adhesive may be above 150 seconds.

The interface surface 119 may have a cross-sectional width 116. The cross-sectional width 116 may be smaller than 2.0 mm, 1.5 mm, 1.0 mm, 0.9 mm, 0.8 mm, or any value therebetween. The cover 120 may be adhered to the entire interface surface 119 across the entire cross-sectional width 116. Adhering the cover 120 to the entire interface surface 119 may be difficult. The smaller the interface surface 119, the more difficult the it may be to adhere to the entire interface surface 119.

The interface surface 119 may vary in cross-sectional width 116 along the perimeter 105 of the computing device 100. For example, the cross-sectional width 116 may have a first uniform thickness along an edge 112 of the computing device and may have a second uniform thickness along a corner of the computing device.

The cover 120 may include a fabric cover, a metallic cover, other cover materials, or combinations thereof. In one example implementation, the cover 120 may include Alcantara fabric. The cover 120 may be distinct from the support structure 110. In other words, in at least one example implementation, the cover 120 and the support structure are not integrally formed. For example, the cover 120 may be adhered, affixed, fastened, or otherwise connected to the support structure 110.

Figure 3:
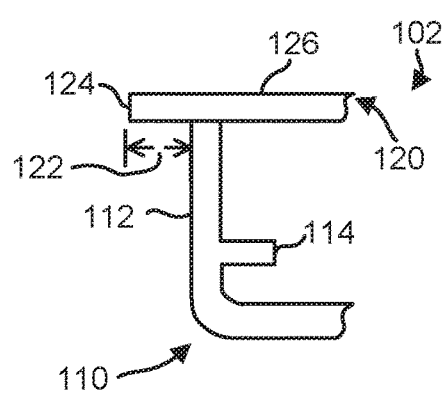
FIG. 3 is a partial cutaway cross-sectional view of the example implementation of FIG. 1.

FIG. 3 is a partial cutaway cross-sectional view of the example implementation of an input device 102 of FIG. 1. As shown the support structure 110 may include a support feature 114. One or more computing components may be connected to one or more support features 114.

The cover 120 may include a cover edge 124 and a cover surface 126. As shown, the cover edge 124 and the cover surface 126 are flat (e.g., straight). In other example implementations, one or more of the cover edge 124 and the cover surface 126 may be curved, stepped, or otherwise shaped. The cover 120 may form a gap 122 between an outermost (e.g., furthest from the support structure 110) point of the cover edge 124 and the edge 112 of the support structure 110. As shown in FIGS. 2 and 3, the edge 112 of the support structure 110 may have a straight vertical portion.

Figure 4:
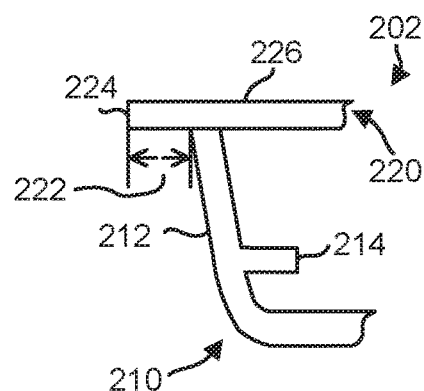
FIG. 4 is a partial cutaway cross-sectional view of another example implementation of a computing device.

FIG. 4 is a partial cutaway cross-sectional view of another example implementation of a computing component of a computing device. As with FIG. 3, the illustrated computing component is an input device 202. The computing component may have a support structure 210 and a cover 220 that may be connected by an adhesive 211 at an interface surface 219 of the support structure 210 and a bottom surface of the cover 220.

The interface surface 219 may have a cross-sectional width 216. The cross-sectional width 216 may be smaller than 2.0 mm, 1.5 mm, 1.0 mm, 0.9 mm, 0.8 mm, or any value therebetween. The cover 220 may be adhered to the entire interface surface 219 across the entire cross-sectional width 216. The interface surface 219 may vary in cross-sectional width 216 along the perimeter (e.g., perimeter 105) of the computing device 200.

The support structure 210 may include one or more edges 212 and/or one or more support features 214. The cover 220 may include a cover edge 224 and a cover surface 226. The cover 220 may form a gap 222 between an outermost (e.g., furthest from the support structure 210) point of the cover edge 224 and the edge 212 of the support structure 210. As shown in FIG. 4, the edge 212 of the support structure 210 may have a slanted (e.g., diagonal) portion. In other example implementations, the gap may be measured between the outermost point of the cover edge and the outermost portion of the edge of the support structure.

Figure 5:
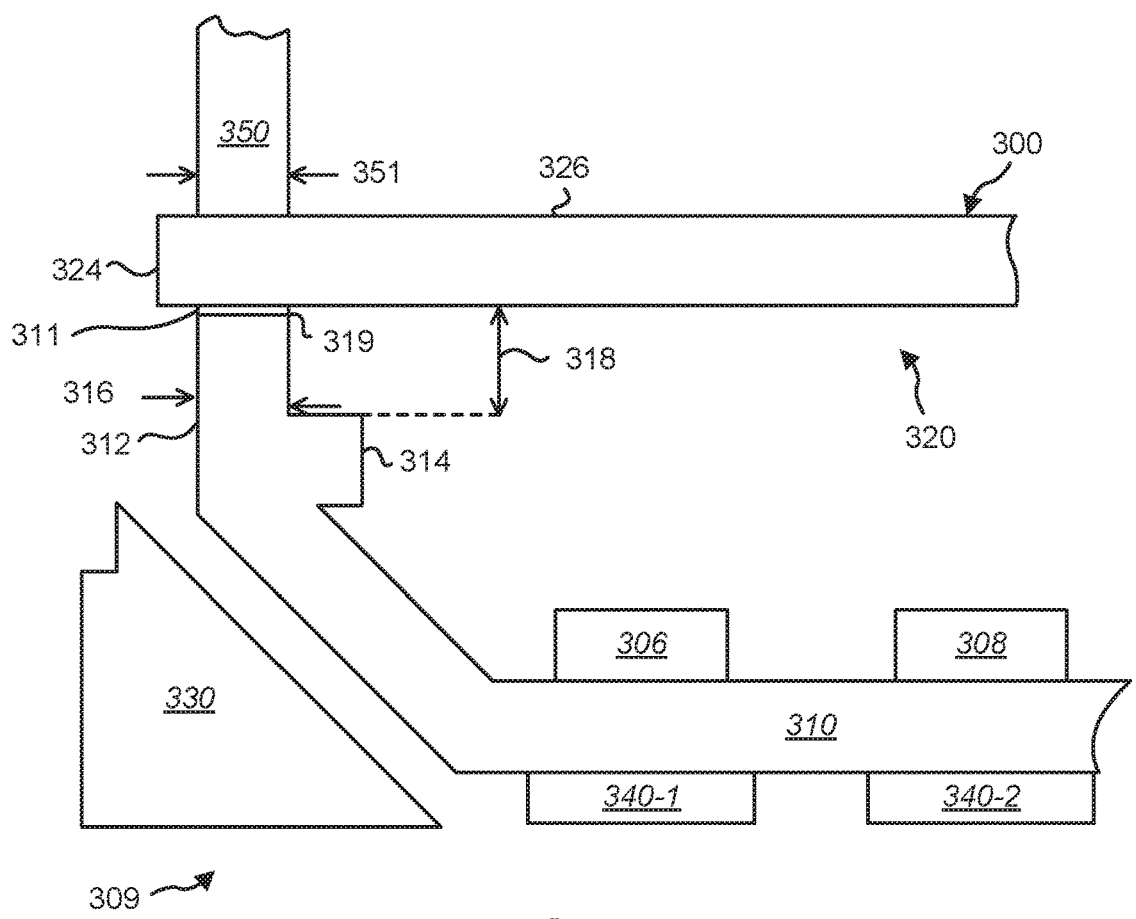
FIG. 5 is a partial cutaway cross-sectional view of an example implementation of a thermal application apparatus with an example implementation of a support structure.

FIG. 5 is a partial cutaway cross-sectional view of an example implementation of a thermal application apparatus 309 with an example implementation of a computing device 300. The computing device 300 may include a power storage device 306 (e.g., a battery), a processor 308, other computing components, or combinations thereof. As described above, a cover 320 may be adhered to a support structure 310 by an adhesive 311. The adhesive 311 may be applied to a bottom surface of the cover 320 and/or may be cured to an interface surface 319 of the support structure 310.

The interface surface 319 may have a cross-sectional width 316. The cross-sectional width 316 may be smaller than 2.0 mm, 1.5 mm, 1.0 mm, 0.9 mm, 0.8 mm, or any value therebetween. The cover 320 may be adhered to the entire interface surface 319 across the entire cross-sectional width 316. The interface surface 319 may vary in cross-sectional width 316 along the perimeter (e.g., perimeter 105) of the computing device 300.

In at least one example implementation of a method of manufacturing a computing device (e.g., computing device 300), a thermal application apparatus 309 may be used to cure the adhesive 311. In the example implementation of a thermal application apparatus 309 shown in FIG. 5, the thermal application apparatus 309 may include one or more heating sources 330 and/or cooling sources 340.

The heating sources 330 may include resistive heaters. For example, the resistive heaters may include brass and/or may be coated with silicone. The heating sources 330 may be capable of applying heat between 150 and 260 degrees Celsius. The heating sources 330 may be located at various locations of the thermal application apparatus 309. In other words, the heating sources 330 may be located at various locations of the computing device 300. As shown, for example, one or more heating sources 330 may be located on a lower edge (e.g., side) of the support structure 310. The heating sources 330 may facilitate curing of the adhesive 311, however, in at least one example implementation, the heating sources 330 may heat computing components.

Computing components, such as power storage device 306 and/or processor 308 may be damaged by heat provided by one or more heating sources 330 (and/or a heated press 350). For example, if a power storage device 306 exceeds 100 degrees Celsius, the life and/or performance of the power storage device 360 may be affected. Thus, balancing heat to cure the adhesive 311 while keeping one or more computing components cool may be desirable.

The cooling sources 340 may be capable of applying cold between 5 and 15 degrees Celsius. Cooling sources 340 may be used to reduce the effects of heat from one or more heat sources 330 from affecting one or more computing components. As shown, the thermal application apparatus 309 may include a plurality of cooling sources 340-1, 340-2 located on the bottom of the support structure 310. In other example implementations, one or more cooling sources 340 may be located at various locations of the thermal application apparatus 309.

The first cooling source 340-1 is shown beneath the power storage device 306 and the second cooling source 340-2 is shown beneath the processor 308. In other example implementations, a single cooling source 340 may be located below a plurality of computing components. The computing components are shown being directly mounted to the support structure 310. In other example implementations, the computing components may be indirectly connected to the support structure 310.

The thermal application apparatus 309 may include a press 350. The press 350 may be used to facilitate curing of the adhesive 311. The press 350 may be a closed loop load cell. The press 350 may be capable of applying a pressure of at least 345 kPa to the cover 320 and/or the adhesive 311. The press 350 may apply pressure to the cover 320 above at least a portion of the interface surface 319. As shown, the press 350 may have a cross-sectional width 351 that is larger than the cross-sectional width 316 of the interface surface 319. The press 350 may include a silicone covered pressing surface (not shown). For example, the press 350 may include silicone covered brass.

The press 350 may be a heating source 330. In some example implementations, the press 350 may be the only heating source 330. In other example implementations, the press 350 may not be a heating source 330. The material of the cover 320 may affect the ability of the press 350 to function as a heating source 330. For example, some cover materials, such as fabric, may have a higher thermal resistance than a metallic cover material. For cover materials with a higher thermal resistance, higher heat may need to be applied through the press 350.

Figure 6:
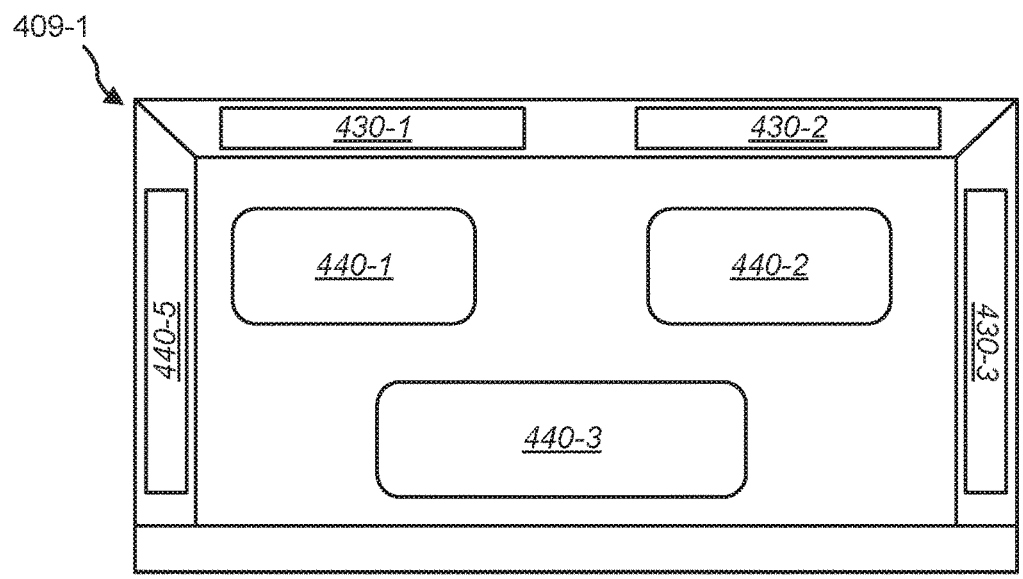
FIG. 6 is a top perspective view of a lower portion of a thermal application apparatus.

FIG. 6 is a top perspective view of a lower portion 409-1 of a thermal application apparatus. The lower portion 409-1 may include one or more heating sources 430 and/or cooling sources 440. As shown, the heating sources 430 and cooling sources 440 may be located at various positions. The present example implementation may include eleven (four are shown) heating sources 430 and three cooling sources 440. In other example implementations, more or fewer heating sources 430 and cooling sources 440 may be used. The cooling sources 440 may be located near one or more computing components. The heating sources 430 may be located near the interface surface (e.g., interface surfaces 119, 219, 319, 419) of the support structure (110, 210, 310, 410).

Figure 7:
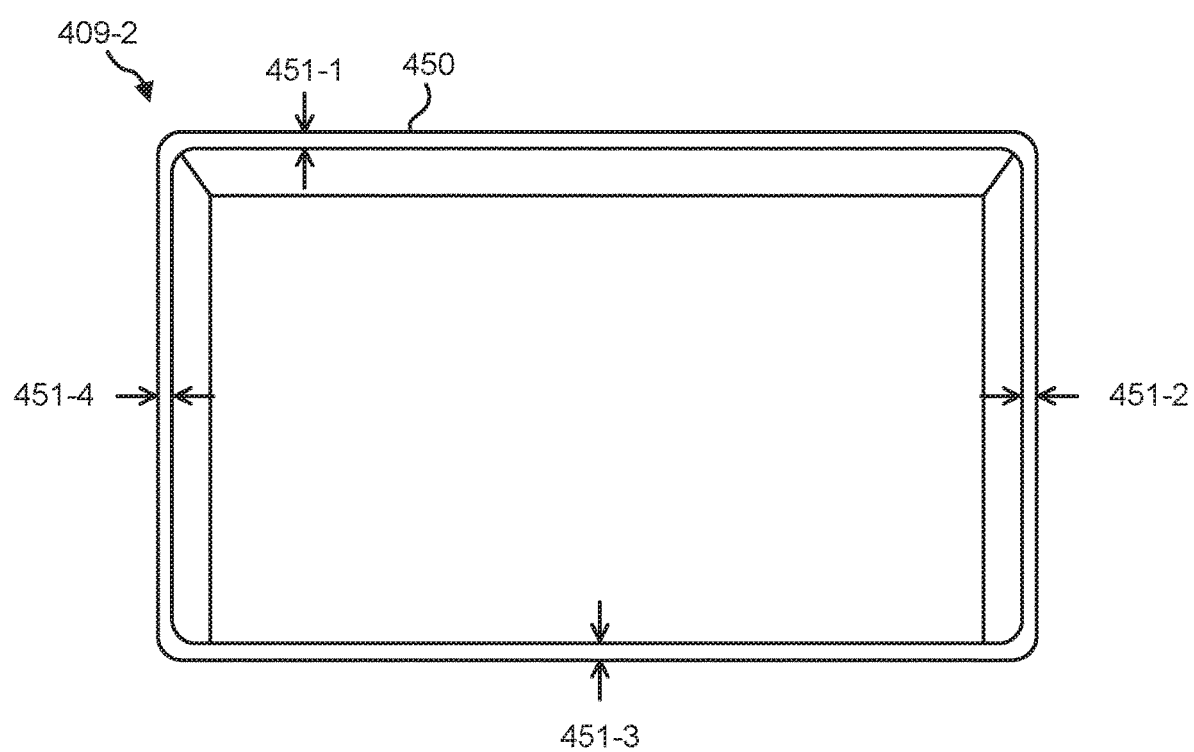
FIG. 7 is a bottom perspective view of an upper portion of a thermal application apparatus.

FIG. 7 is a bottom perspective view of an upper portion 409-2 of a thermal application apparatus. The upper portion 409-2 is shown with a press 450 extending around the entire perimeter of the upper portion 409-2. In other example implementations, the press 450 may extend around less than the entire perimeter. The press 450 may have one or more cross-sectional widths 451. The upper cross-sectional width 451-1, the right cross sectional width 451-2, the bottom cross-sectional width 451-3, and the left cross-sectional width 451-4 may be the same. In other example implementations one or more of the cross-sectional widths 451 may be different.

Figure 8:
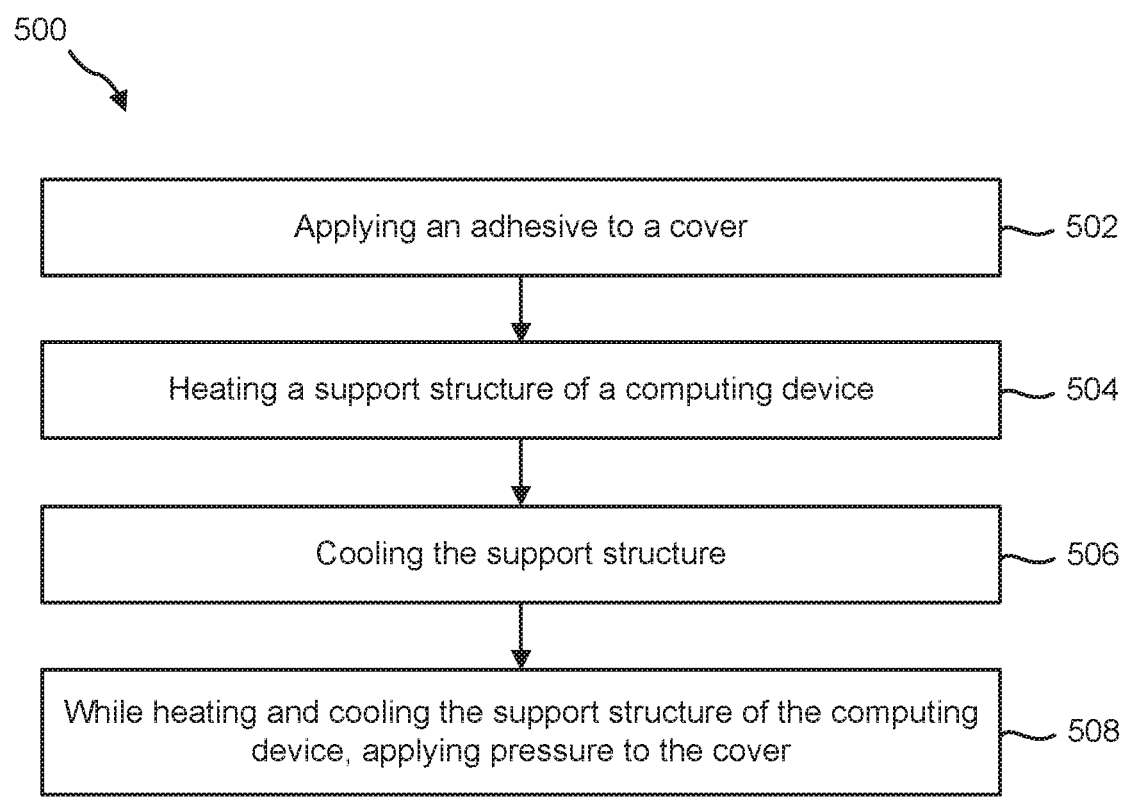
FIG. 8 is an example implementation of a method of manufacturing a computing device.

One or more example implementations of a thermal application apparatus may be used to perform a method of manufacturing at least one computing device described herein. FIG. 8 illustrates an example implementation of a method 500 of manufacturing a computing device. The method 500 may include applying 502 an adhesive to a cover. For example, the adhesive may be directly applied to the cover and/or to the interface surface. The support structure of the computing device may be heated 504. The support structure of the computing device may be cooled 506. While the support structure is being heated and cooled, pressure may be applied 508 to the cover. The pressure may be applied 508 with a press. The press may be a closed loop load cell. The press may apply 508 at least 345 kPa to the cover.

In some example implementations, the computing device may be located within a thermal application apparatus (e.g., thermal application apparatus 309, 409) prior to heating or cooling the support structure of the computing device. A datum structure and/or position sensors may be used to locate the computing device within the thermal application apparatus.

In some example implementations, heating 504 the support structure of a computing device includes using closed loop feedback. Closed loop feedback may provide higher success in situations where computing components are installed prior to curing the adhesive. Infrared temperature measurements may be used in the closed loop feedback to maintain temperatures at safe (e.g., non-damaging) levels.

After pressure is applied 508 to the cover, the cover and the computing device may be clamped while the adhesive cures. A cooling press may be used after the pressure is applied to the cover.

At least one example implementation of a computing device described herein provides a cover that is adhered along an entirety of a cross-sectional width of an interface surface of a support structure. At least one example implementation of a computing device described herein provides a cover that is adhered along an entirety of a cross-sectional width between 0.8 mm and 1.5 mm of an interface surface of a support structure along a length of greater than 100 mm.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one example implementation" or "an example implementation" of the present disclosure are not intended to be interpreted as excluding the existence of additional example implementations that also incorporate the recited features. For example, any element described in relation to an example implementation herein may be combinable with any element of any other example implementation described herein. Numbers, percentages, ratios, or other values stated herein are intended to include that value, and also other values that are "about" or "approximately" the stated value, as would be appreciated by one of ordinary skill in the art encompassed by example implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to example implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the example implementations that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described example implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing device, comprising:
   a support structure having an interface surface with a cross-sectional width, the interface surface extending to a peripheral edge of the computing device;
   a heat activated adhesive applied to the interface surface, wherein the heat activated adhesive is configured to be activated by heating the heat activated adhesive to above 100 degrees Celsius for at least 150 seconds; and
   a cover adhered to the interface surface of the support structure along an entirety of the cross-sectional width of the interface surface to the peripheral edge by the heat activated adhesive, the heat activated adhesive being separate from the cover.

2. The computing device of claim 1, wherein the cross-sectional width is between 0.8 mm and 1.5 mm.

3. The computing device of claim 1, wherein the interface surface is flat.

4. The computing device of claim 1, wherein the interface surface has a length of greater than 100 mm.

5. The computing device of claim 1, wherein the interface surface extends around a majority of an edge of the computing device.

6. The computing device of claim 1, wherein the cover is microfiber fabric.

7. The computing device of claim 1, wherein the heat activated adhesive is a heat activated film.

8. The computing device of claim 1, wherein the support structure includes a surface treatment.

9. A computing device, comprising:
   a support structure having a flat interface surface with a cross-sectional width between 0.8 mm and 1.5 mm and a length of greater than 100 mm, the flat interface surface extending to a peripheral edge of the computing device;
   a heat activated film applied to the interface surface, wherein the heat activated film is configured to be activated by heating the heat activated adhesive to above 100 degrees Celsius for at least 150 seconds; and
   a microfiber fabric cover affixed to the interface surface of the support structure along an entirety of the cross-sectional width of the interface surface to the peripheral edge and around a majority of the peripheral edge of the computing device with the heat activated film, a modulus of elasticity of the cover is less than a modulus of elasticity of the interface surface, the cover being an outermost surface of the computing device in an open configuration.

10. A method of manufacturing a computing device, comprising:
    applying an adhesive to a cover;
    actively heating a first portion of a support structure of a computing device;
    while actively heating the support structure of the computing device, applying pressure to the cover;
    while actively heating the support structure of the computing device at a first location, actively cooling a second portion of the support structure of the computing device at a second location; and
    while actively cooling the support structure of the computing device, applying pressure to the cover.

11. The method of claim 10, wherein the adhesive is a heat activated adhesive and wherein heating the support structure of the computing device includes using a heating source of between 150 and 260 degrees Celsius.

12. The method of claim 10, wherein the heating source includes heat sources on a top surface of the support structure.

13. The method of claim 10, wherein the heating source includes heat sources on one or more of a bottom surface of the support structure and a side surface of the support structure.

14. The method of claim 10, wherein actively cooling the support structure of the computing device includes using a plurality of cooling sources.

15. The method of claim 10, wherein cooling the support structure of
    the computing device includes using a cooling source of between 5 and 15 degrees Celsius.

16. The method of claim 10, wherein applying pressure to the cover
    further comprises applying pressure with a press and wherein the press is a closed loop load cell.

17. The method of claim 10, further comprising, after
    applying the adhesive to the cover, locating the computing device prior to heating and cooling the support structure of the computing device.

18. The method of claim 10, wherein heating the support structure of a
    computing device includes using closed loop feedback.

19. The method of claim 10, further comprising, after
    applying pressure to the cover, transferring the cover and the computing device to a cooling press.

20. The computing device of claim 1, wherein at least a portion of the heat activated adhesive extends to the peripheral edge of the computing device.

* * * * *